United States Patent

Kurihara et al.

Patent Number: 5,208,820
Date of Patent: May 4, 1993

[54] OPTICAL DEVICE WITH LOW-RESISTIVE MULTI-LEVEL REFLECTING STRUCTURE

[75] Inventors: Kaori Kurihara; Mitsunori Sugimoto, both of Tokyo, Japan

[73] Assignee: NEC Corporation, Tokyo, Japan

[21] Appl. No.: 817,620

[22] Filed: Jan. 7, 1992

[30] Foreign Application Priority Data

Jan. 8, 1991 [JP] Japan .................................. 3-644
May 24, 1991 [JP] Japan .............................. 3-119656

[51] Int. Cl.⁵ .............................................. H01S 3/19
[52] U.S. Cl. ........................................ 372/45; 372/96
[58] Field of Search .................... 372/45, 96, 43, 44

[56] References Cited

U.S. PATENT DOCUMENTS 5,018,157  5/1991  Deppe et al. ...................... 372/45
5,136,345  8/1992  Kasahara .......................... 372/45

FOREIGN PATENT DOCUMENTS 0225885  10/1991  Japan ............................... 372/45

OTHER PUBLICATIONS

Submilliamp Threshold Vertical-Cavity Laser Diodes, Applied Physics Letters, Oct. 1990 vol. 57, pp. 1605-1607, by R. S. Geels and L. A. Coldren.

Primary Examiner—Georgia Y. Epps
Attorney, Agent, or Firm—Burns, Doane, Swecker & Mathis

[57] ABSTRACT

An optical device has a multi-layer reflecting structure provided in association with an active layer for allowing light to oscillate, and the multi-layer reflecting structure is implemented by a plurality of units each having a high refractive film, a low refractive film and a layer for improving conductivity of the multi-layer reflecting structure, wherein the layer is implemented by a heavily doped impurity region with an impurity profile tracing plots of a delta function or by a quasi-graded super-lattice film microscopically graded in composition between the high and low refractive films.

10 Claims, 8 Drawing Sheets

OPTICAL DEVICE WITH LOW-RESISTIVE MULTI-LEVEL REFLECTING STRUCTURE

FIELD OF THE INVENTION

This invention relates to an optical device and, more particularly, to a multi-layer reflecting structure incorporated in the optical device.

DESCRIPTION OF THE RELATED ART

An optical information parallel processing system and a parallel optical communication system requires various optical devices, and a light emitting device is an indispensable component for these systems. A surface emitting laser device with a vertical cavity is preferable as the light emitting device, because the surface emitting laser devices can be arranged in a two-dimensional array. FIG. 1 shows a typical example of the surface emitting laser device fabricated on a substrate 1 of n-type gallium arsenide. On the substrate 1 are grown a lower semiconductor multi-layer reflecting structure 2, a lower clad layer 3 of n-type aluminum gallium arsenide expressed by the formula of $Al_{0.3}Ga_{0.7}As$, an active layer 4 of intentionally undoped indium gallium arsenide expressed by the formula of $In_{0.2}Ga_{0.8}As$, an upper clad layer 5 of p-type aluminum gallium arsenide expressed by the formula of $Al_{0.3}Ga_{0.7}As$ and an upper semiconductor multi-layer reflecting structure 6 which are shaped into a cylindrical configuration. A low refractive film 2a of n-type aluminum arsenide and a high refractive film 2b of n-type gallium arsenide are multiply layered to form the lower semiconductor multi-layer reflecting structure 2, and each pair of low and high refractive films 2a and 2b is as thin as a quarter of the lasing oscillation wavelength in each semiconductor medium. Similarly, a low refractive film 6a of p-type aluminum arsenide and a high refractive film 6b of n-type gallium arsenide are multiply layered to form the upper semiconductor multi-layer reflecting structure 6, and each pair of low and high refractive films 6a and 6b is also as thin as a quarter of the lasing oscillation wavelength in each semiconductor medium. The reason why the active layer 4 is accompanied with the lower and upper semiconductor multi-layer reflecting structures 2 and 6 is that the active layer 4 of the vertical cavity type is much thinner than the active layer of a horizontal cavity type, and, for this reason, it is necessary to reduce the mirror optical loss by means of these lightly reflective multi-layer structure.

An upper electrode 7 of gold is provided on the top surface of the upper semiconductor multi-layer reflecting structure 6, and a lower electrode 8 of gold-germanium-nickel alloy is formed on the bottom surface of the substrate 1. An opening 8a is formed in the lower electrode 8, and light is taken out from the opening 8a.

In operation, positive bias voltage is applied to the upper electrode 7, and the lower electrode 8 is grounded. Current flows through the upper and lower semiconductor multi-layer structures 2 and 6 as well as through the lower and upper clad layers 3 and 5 into the active layer 4, and light is increased in magnitude by the aid of the lower and upper semiconductor multi-layer reflecting structures 2 and 6. The light thus amplified is emitted though the opening 8a.

One of the prior art surface emitting laser devices is disclosed by R. S. Geels and L. A. Coldren in Applied Physics Letters, 1990 vol. 57, pages 1605 to 1607, and Geels et al reports that the surface emitting laser device with 7 microns×7 microns oscillates at threshold current of 0.7 milliamperes.

FIG. 2 shows the energy band produced in the pair of low and high refractive films 2a and 2b incorporated in the lower semiconductor multi-layer reflecting structure 2 in thermal equilibrium. Ef stands for Fermi-level constant through the low and high refractive films 2a and 2b in the thermal equilibrium. The bottom edges of the conduction bands are represented by Ec, and Ev is indicative of the upper edges of the valence bands. Since compound semiconductor materials with large difference in refractive index are different in band gap, undesirable spikes take place at the heterojunctions between the compound semiconductor materials multiply layered. Therefore, the prior art surface emitting laser device has undesirable spikes 9a and 9b at the heterojunctions between the low and high refractive films 2a and 2b, and spikes are also produced at the heterojunctions between the low and high refractive films 6a and 6b of the upper semiconductor multi-layer reflecting structure 6.

When the prior art surface emitting laser diode is biased, the energy band in the pair of low and high refractive films 2a and 2b is deformed as shown in FIG. 3. The bias voltage affects the height of each spike. Namely, the spikes 9a at the heterojunctions with the n-type gallium arsenide negatively biased are grown and enlarged, and the spikes 9a serve as a barrier against electron current. The other spikes 9b are shrunk, and are negligible in comparison with the spikes 9a. The height of each spike is dominated by the difference in electron affinity as well as by the magnitude of the bias voltage level, and the width of each spike is dependent on the impurity concentrations and the dielectric constants. For example, if the n-type aluminum arsenide and the n-type gallium arsenide are doped at $1.5 \times 10^{17}$ $cm^3$, each spike is about 200 angstroms in width without any bias voltage level.

In the upper semiconductor multi-layer structure 6, the spikes at the heterojunctions with the p-type gallium arsenide positively biased are grown and enlarged, and the spikes serve as a barrier against hole current. The other spikes are similarly shrunk, and are negligible in comparison with the enlarged spikes.

Thus, the lower and upper semiconductor multi-layer reflecting structures are highly resistive against the current due to the spikes to be enlarged under the biased condition. If the low and high refractive films 2a/2b and 6a/6b are heavily doped throughout the thickness, the give rise to increase tunneling current, and the resistances would be decreased. However, the low and high refractive films 2a/2b and 6a/6b are epitaxially grown to form the lower and upper multi-layer reflecting structures 2 and 6, and the heavy doping encounters problems in quality of crystal as well as in the surface homology. In fact, the bulk of aluminum arsenide is hardly increased, and the maximum n-type impurity concentration is of the order of $5 \times 10^{17}$ $cm^3$. For this reason, the approach, i.e., the heavy doping is not effective against the spikes.

If the composition of the compound semiconductor material is gradually changed around the heterojunctions, the band edges at the heterojunctions are graded, and the undesirable spikes are lowered. Therefore, the resistances of the semiconductor multi-layer reflecting structures are decreased. However, the graded profile of composition requires kaleidoscopic changes in growing temperature, and such a complex sequence decreases the production yield and increases the production cost. The prior art surface emitting laser device proposed by Geels et al is provided with a quasi-graded layer with a super-lattice structure of gallium arsenide/aluminum arsenide system between the high refractive film of gallium arsenide and the low refractive film of aluminum arsenide, and the super-lattice structure is implemented by nine steps gradually varied in ratio between the thickness of the low and high refractive films. However, the quasi-graded layer of the prior art surface emitting laser device disclosed by Geels et al merely achieves 100 ohms in spite of the complex process sequence.

SUMMARY OF THE INVENTION

It is therefore an important object of the present invention to provide an optical device which has a low resistive multi-layer reflecting structure without sacrifice of quality of crystal, the surface homology, the production yield and the production cost.

It is also an important object of the present invention to provide a process of fabricating an optical device which has a low resistive multi-layer reflecting structure without sacrifice of quality of crystal, the surface homology, the production yield and the production cost.

To accomplish the object, the present invention proposes to form a highly doped region in a low refractive film of a multi-layer reflecting structure extending from one of the heterojunctions.

Another applicant's approach is to insert a quasi-graded super-lattice structure with micro mesa-stripes graded in composition in atom between low and high refractive films.

In accordance with one aspect of the present invention, there is provided an optical device fabricated on a substrate, comprising: a) an active layer provided for light; b) a lower multi-layer reflecting structure provided on one side of the active layer, and having a plurality of combinations each implemented by an n-type low refractive film and an n-type high refractive film different in refractive index as well as in energy band gap; c) an upper multi-layer reflecting structure provided on the opposite side of the active layer, and having plurality of combinations each implemented by a p-type low refractive film and a p-type high refractive film different in refractive index as well as in energy band gap; and d) a pair of electrodes operative to apply bias voltage across the lower and upper multi-layer reflecting structures to the active layer for producing light, at least one of the n-type low refractive film and the p-type low refractive layer having a heavily doped region extending from a first heterojunction negatively biased toward a second heterojunction on the opposite side thereof in case of the n-type low refractive film or from the second heterojunction positively biased toward the first heerojunction in case of the p-type low refractive film, the heavily doped region having an impurity profile substantially tracing plots of a delta function.

In accordance with another aspect of the present invention, there is provided an optical device fabricated on a substrate having atomic steps formed at intervals on a major surface thereof and terrace portions each extending over one of the intervals, comprising: a) a lower multi-layer reflecting structure of a first conductivity type grown on the major surface, and implemented by a plurality of semiconductor microstructures, each of the semiconductor microstructures having a high refractive film formed of a first compound semiconductor material mainly composed of a first element and a second element, a low refractive film formed of a second compound semiconductor material mainly composed of the second element and a third element, and a quasi-graded super-lattice layer inserted between the high refractive film and the low refractive film, and formed of a third compound semiconductor material mainly composed of the first to third elements, the atomic steps and the terrace portions being sequentially transferred to a surface of each high refractive film, to a surface of each quasi-graded super-lattice layer and to a surface of each low refractive film, the quasi-graded super-lattice layer being implemented by a plurality of non-inverted mesa-shaped micro-stripes of the first compound semiconductor material interdigitated with a plurality of inverted mesa-shaped micro-stripes of the second compound semiconductor material, each of the non-inverted mesa-shaped micro-stripes projecting from one of the terrace portions on the surface of the high refractive film in such a manner that the width thereof is gradually decreased, each of the inverted mesa-shaped micro-stripes interdigitated between two of the non-inverted mesa-shaped micro-stripes projecting in such a manner that the width thereof is gradually increased; b) an active structure for light formed on the lower multi-layer reflecting structure; c) an upper multi-layer reflecting structure formed on the active structure, and having a second conductivity opposite to the first conductivity; and d) a pair of electrodes for applying bias voltage across the lower and upper multi-layer reflecting structures to the active structure.

In accordance with yet another aspect of the present invention, there is provided a process of fabricating an optical device comprising, the steps of: a) preparing a substrate having a crystal surface oblique from a predetermined orientation selected from a low index crystal surface so that atomic steps take place at intervals, terrace portions respectively extending over the intervals; b) epitaxially growing a first compound semiconductor material mainly composed of a first element and a second element on the crystal surface for forming a high refractive film, the atomic steps and the terrace portions being transferred to a surface of the high refractive film; c) epitaxially growing the first compound semiconductor material on the surface of the high refractive film so as to form a plurality of mesa-shaped micro-stripes respectively projecting from the terrace portions of the surface of the high refractive film, each of the plurality of mesa-shaped micro-stripes gradually decreasing the width thereof; d) epitaxially growing a second compound semiconductor material mainly composed of the second element and a third element so as to form a plurality of inverted mesa-shaped micro-stripes interdigitated with the plurality of mesa-shaped micro-stripes, each of the inverted mesa-shaped micro-stripes increasing the width thereof so that the plurality of mesa-shaped micro-stripes and the plurality of inverted mesa-shaped micro-stripes forming in combination a quasi-graded super-lattice layer of a third compound semiconductor material mainly composed of the first to third elements, the atomic steps and the terrace portions being transferred to a surface of the quasi-graded super-lattice layer; e) epitaxially growing the second compound semiconductor material on the surface of the quasi-graded super-lattice layer for forming a low refractive film, the atomic steps and the terrace portions being transferred to a surface of the low refractive film; f) repeating the steps of c) to e) predetermined times; and g) completing the optical device.

In accordance with yet another aspect of the present invention, there is provided a multi-layer reflecting structure fabricated on a substrate and applied with bias voltage for producing light, comprising: a plurality of combinations each having a) a low refractive film, and b) a high refractive film different in refractive index as well as in energy band gap from the low refractive film, the low refractive film having a heavily doped region extending from a first heterojunction negatively biased in toward a second heterojunction on the opposite side thereof case of n-type conductivity or from the second heterojunction positively biased toward the first heterojunction in case of p-type conductivity.

In accordance with yet another aspect of the present invention, there is provided a quasi-graded super-lattice structure fabricated on a substrate having atomic steps formed at intervals on a major surface thereof and terrace portions each extending over one of the intervals, comprising: a high refractive film formed of a first compound semiconductor material mainly composed of a first element and a second element, a low refractive film formed of a second compound semiconductor material mainly composed of the second element and a third element, and a quasi-graded super-lattice layer inserted between the high refractive film and the low refractive film, and formed of a third compound semiconductor material mainly composed of the first to third elements, the atomic steps and the terrace portions being sequentially transferred to a surface of each high refractive film, to a surface of each quasi-graded super-lattice layer and to a surface of each low refractive film, the quasi-graded super-lattice layer being implemented by a plurality of non-inverted mesa-shaped micro-stripes of the first compound semiconductor material interdigitated with a plurality of inverted mesa-shaped micro-stripes of the second compound semiconductor material, each of the non-inverted mesa-shaped micro-stripes projecting from one of the terrace portions on the surface of the high refractive film in such a manner that the width thereof is gradually decreased, each of the inverted mesa-shaped micro-stripes interdigitated between two of the non-inverted mesa-shaped micro-stripes projecting in such a manner that the width thereof is gradually increased.

In accordance with yet another aspect of the present invention, there is provided a process of fabricating a quasi-graded super-lattice layer comprising the steps of: a) preparing a substrate having a crystal surface oblique from a predetermined low index crystal surface so that atomic steps take place at intervals, terrace portions respectively extending over the intervals; b) epitaxially growing a first compound semiconductor material mainly composed of a first element and a second element on the crystal surface for forming a high refractive film, the atomic steps and the terrace portions being transferred to a surface of the high refractive film; c) epitaxially growing the first compound semiconductor material on the surface of the high refractive film so as to form a plurality of mesa-shaped micro-stripes respectively projecting from the terrace portions of the surface of the high refractive film, each of the plurality of mesa-shaped micro-stripes gradually decreasing the width thereof; d) epitaxially growing a second compound semiconductor material mainly composed of the second element and a third element so as to form a plurality of inverted mesa-shaped micro-stripes interdigitated with the plurality of mesa-shaped micro-stripes, each of the inverted mesa-shaped micro-stripes increasing the width thereof so that the plurality of mesa-shaped micro-stripes and the plurality of inverted mesa-shaped micro-stripes forming in combination a quasi-graded super-lattice layer of a third compound semiconductor material mainly composed of the first to third elements, the atomic steps and the terrace portions being transferred to a surface of the quasi-graded super-lattice layer; and e) epitaxially growing the second compound semiconductor material on the surface of the quasi-graded super-lattice layer for forming a low refractive film, the atomic steps and the terrace portions being transferred to a surface of the low refractive film.

BRIEF DESCRIPTION OF THE DRAWINGS

The feature and advantages of the optical device with low resistive multi-layer reflecting structure according to the present invention will be more clearly understood from the following description taken in conjunction with the accompanying drawings in which.

DESCRIPTION OF THE PREFERRED EMBODIMENTS

First Embodiment

Figure 1:
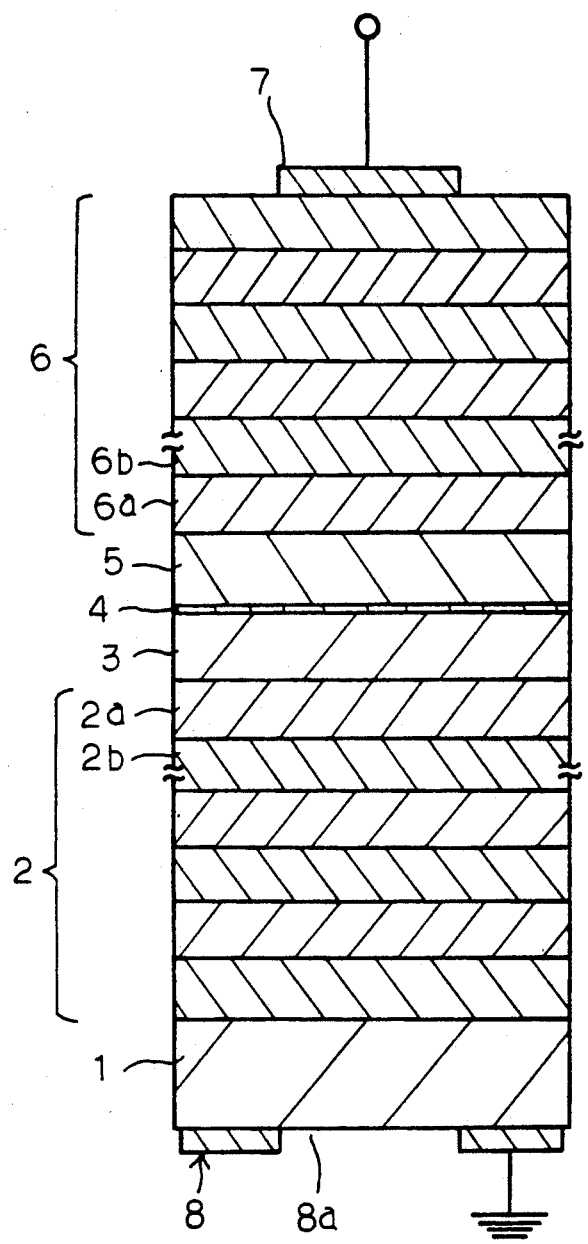
FIG. 1 is a cross sectional view showing the structure of the prior art surface emitting laser device.
Figure 2:
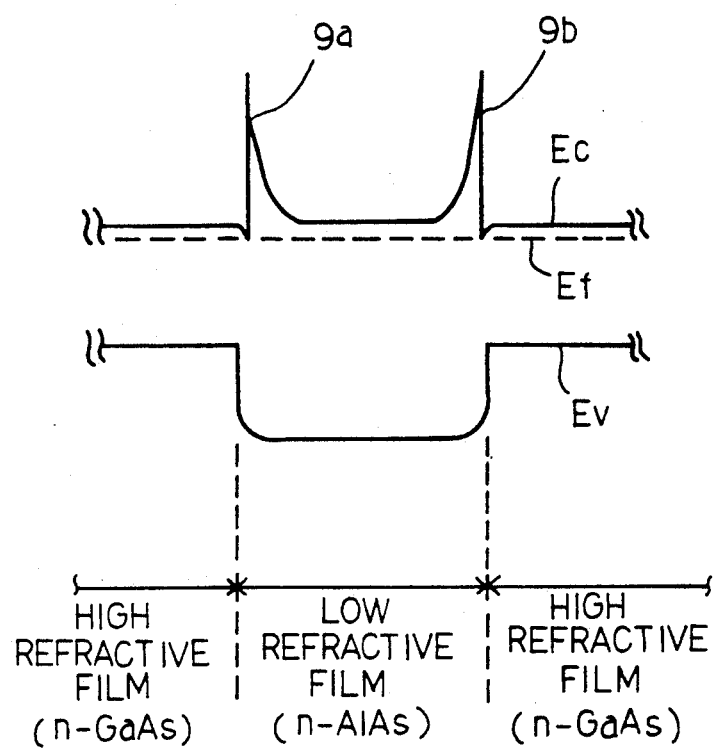
FIG. 2 is a diagram showing the energy band produced in the semiconductor multi-layer reflecting structure incorporated in the prior art surface emitting laser device in thermal equilibrium.
Figure 3:
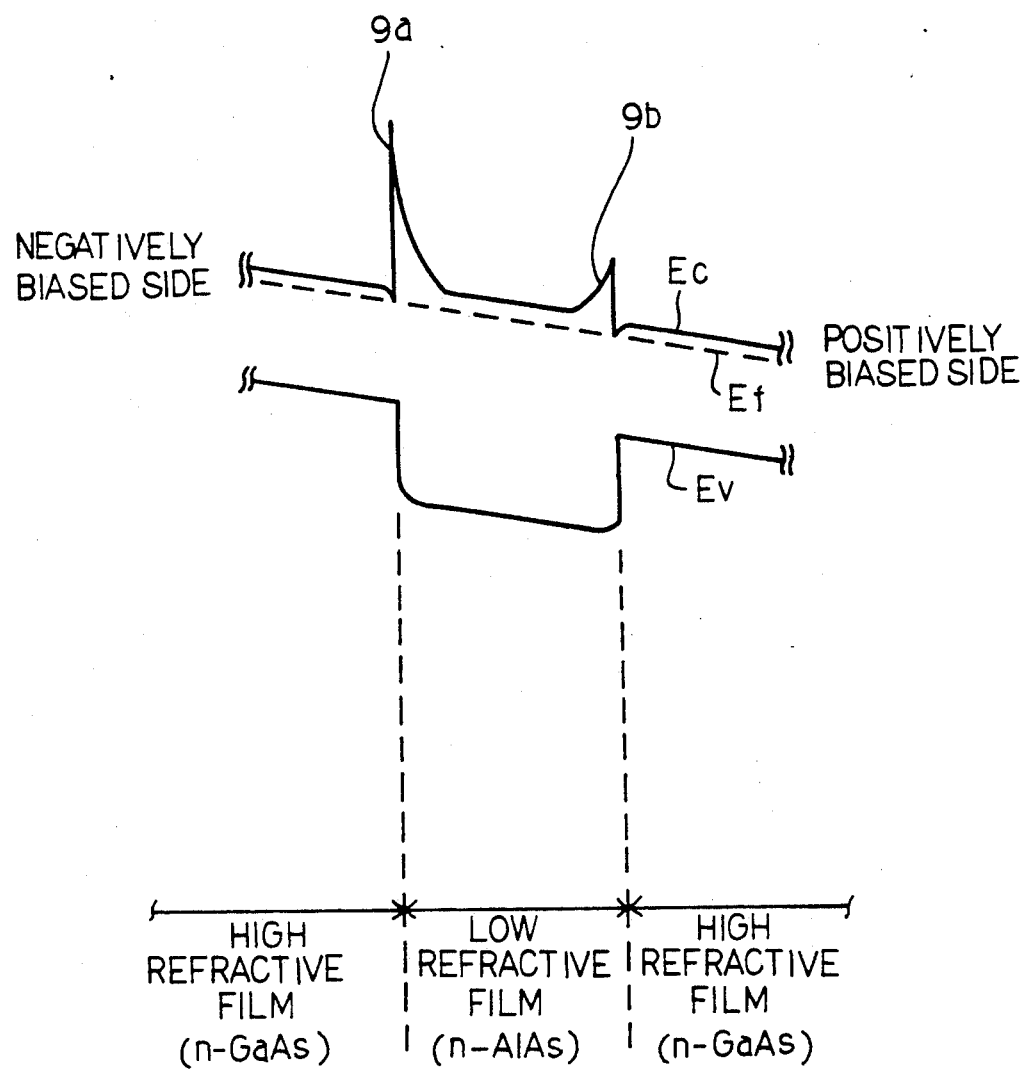
FIG. 3 is a diagram showing the energy band produced in the semiconductor multi-layer reflecting structure incorporated in the prior art surface emitting laser device in a biased state.
Figure 4:
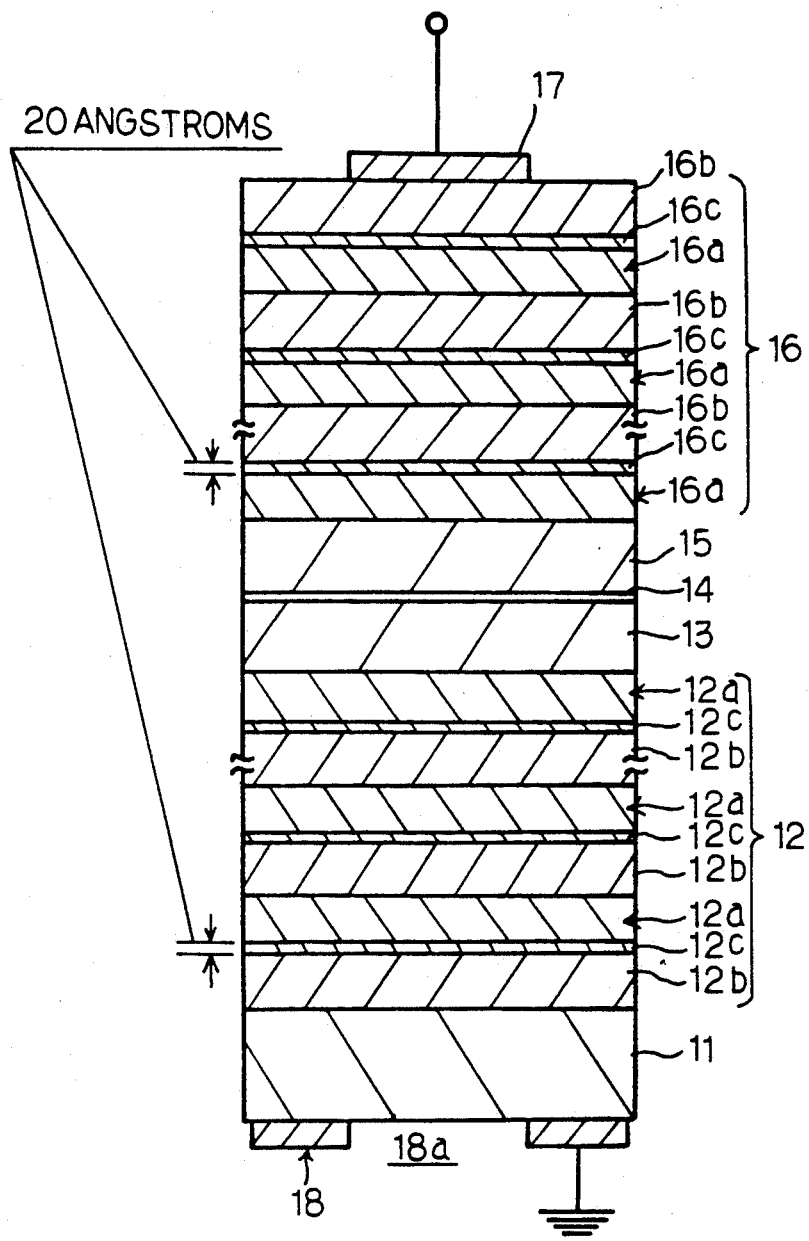
FIG. 4 is a cross sectional view showing the structure of a surface emitting laser device according to the present invention.

Referring to FIG. 4 of the drawings, a surface emitting laser device embodying the present invention is fabricated on a substrate 11 of n-type gallium arsenide. On the substrate 11 are stacked a lower distributed Bragg reflector 12, a lower clad layer 13 of n-type aluminum gallium arsenide expressed by the formula of $Al_{0.3}Ga_{0.7}As$, an active layer 14 of intentionally undoped indium gallium arsenide expressed by the formula of $In_{0.2}Ga_{0.8}As$, an upper clad layer 15 of p-type aluminum gallium arsenide expressed by the formula of $Al_{0.3}Ga_{0.7}As$ and an upper distributed Bragg reflector 16 which are shaped into a cylindrical configuration. The active layer 14 is about 100 angstroms in thickness, and is operative to realize laser oscillation. Each of the lower and upper clad layers 13 and 15 regulates the phase of the laser light. An upper electrode 17 of gold is provided on the upper surface of the upper distributed Bragg reflector 16, and a lower electrode 18 of gold-germanium-nickel is provided on the reverse surface of the substrate 11. An opening 18a is formed in the lower electrode 18, and laser light is taken out from the opening 18a. In operation, positive bias voltage level is applied to the upper electrode 17, and the lower electrode 18 is grounded. The low and high distributed Bragg reflectors 12 and 16 respectively serve as low and high multi-layer reflecting structures.

The lower distributed Bragg reflector 12 is implemented by 20 pairs of low and high refractive films 12a and 12b, and a heavily doped region 12c is formed in each of the low refractive films 12a. The heavily doped region 12c extends from the heterojunction negatively biased rather than the opposite heterojunction, and has an impurity profile substantially tracing plots of a delta function. In this instance, the low refractive film is formed of n-type aluminum arsenide, and the high refractive film is of n-type gallium arsenide. The total thickness of the low and high refractive films 12a and 12b is regulated to be as thin as a quarter of the laser oscillation wavelength in each films. The surface emitting laser device implementing the first embodiment produces the laser light with wavelength of about 0.98 microns, and the low and high refractive films 12a and 12b are about 821 angstroms thick and about 695 angstroms thick. The n-type gallium arsenide is doped at about $1 \times 10^{18}$ cm$^{-3}$, and the n-type aluminum arsenide is doped at about $1 \times 10^{18}$ cm$^{-3}$. However, the impurity concentration of the n-type gallium arsenide may range from about $2 \times 10^{17}$ cm$^{-3}$ to about $2 \times 10^{18}$ cm$^{-3}$, and the impurity concentration of the n-type aluminum arsenide may also range from about $2 \times 10^{17}$ cm$^{-3}$ to about $2 \times 10^{18}$ cm$^{-3}$. The heavily doped region 12c is about 20 angstroms in thickness, and the maximum impurity concentration is about $5 \times 10^{18}$ cm$^{-3}$. The maximum impurity concentration may range from about $3 \times 10^{18}$ cm$^{-3}$ to about $3 \times 10^{19}$ cm$^{-3}$. However, the heavily doped n-type region 12c may be 6 to 8 angstroms in another implementation. When the heavily doped n-type region 12c is greater than zero angstroms and not greater than 100 angstroms, the heavily doped n-type region 12c is effective against the resistance of the lower distributed Bragg reflector 12.

The upper distributed Bragg reflector 16 is implemented by 15 pairs of low and high refractive films 16a and 16b, and a heavily doped region 16c is formed in each of the low refractive films 16a. The heavily doped region 16c extends from the heterojunction positively biased rather than the opposite heterojunction, and has an impurity profile substantially tracing plots of a delta function. In this instance, the low refractive film is formed of p-type aluminum arsenide, and the high refractive film is of p-type gallium arsenide. The total thickness of the low and high refractive films 16a and 16b is also regulated to be as thin as a quarter of the wavelength of the laser light to be produced. Each of the low and high refractive films 16a and 16b ranges from about 2 microns thick to about 3 microns thick depending upon the required reflectivity. The p-type gallium arsenide is doped at about $1 \times 10^{18}$ cm$^{-3}$, and the p-type aluminum arsenide is doped at about $1 \times 10^{18}$ cm$^{-3}$. The heavily doped region 16c is about 20 angstroms in thickness, and the maximum impurity concentration is about $5 \times 10^{18}$ cm$^{-3}$. However, the heavily doped region 16c may be 6 to 8 angstroms in another implementation. If the heavily doped p-type region 16c is greater than zero angstroms and not greater than 100 angstroms, the heavily doped p-type region 16c effectively decreases the resistance of the upper distributed Bragg reflector 16.

The surface emitting laser device according to the present invention is fabricated through a process sequence described hereinbelow. The process sequence starts with preparation of the n-type gallium arsenide substrate 11. Using a molecular beam epitaxy, the high and low refractive films 12a and 12b are sequentially grown on the n-type gallium arsenide substrate 11 for producing the lower distributed Bragg reflector 12, and the heavily doped regions 12c are formed at dose of $1 \times 10^{13}$ cm$^{-2}$. As described hereinbefore, each of the heavily doped regions 12c extends from the lower heterojunction of the low refractive film 12a negatively biased rather than the upper heterojunction thereof, and measures about 20 angstroms. The impurity profile of the heavily doped region 12c substantially traces plots of a delta function. The lower clad layer 13, the active layer 14 and the upper clad layer 15 are further epitaxially grown on the lower distributed Bragg reflector 12 through the molecular beam epitaxy, and the low and high refractive films 16a and 16b are also epitaxially grown on the upper clad layer 15 so as to produce the upper distributed Bragg reflector 16. While each of the low refractive films 16a is grown, p-type impurity atoms are excessively introduced at dose of $1 \times 10^{13}$ cm$^{-2}$ over 20 angstroms in the vicinity of the heterojunction positively biased, and the impurity profile of the heavily doped region 16c substantially traces the plots of a delta function. Upon completion of the upper distributed Bragg reflector 16, the upper electrode 17 and the lower electrode 18 are formed on the respective surfaces.

Figure 5:
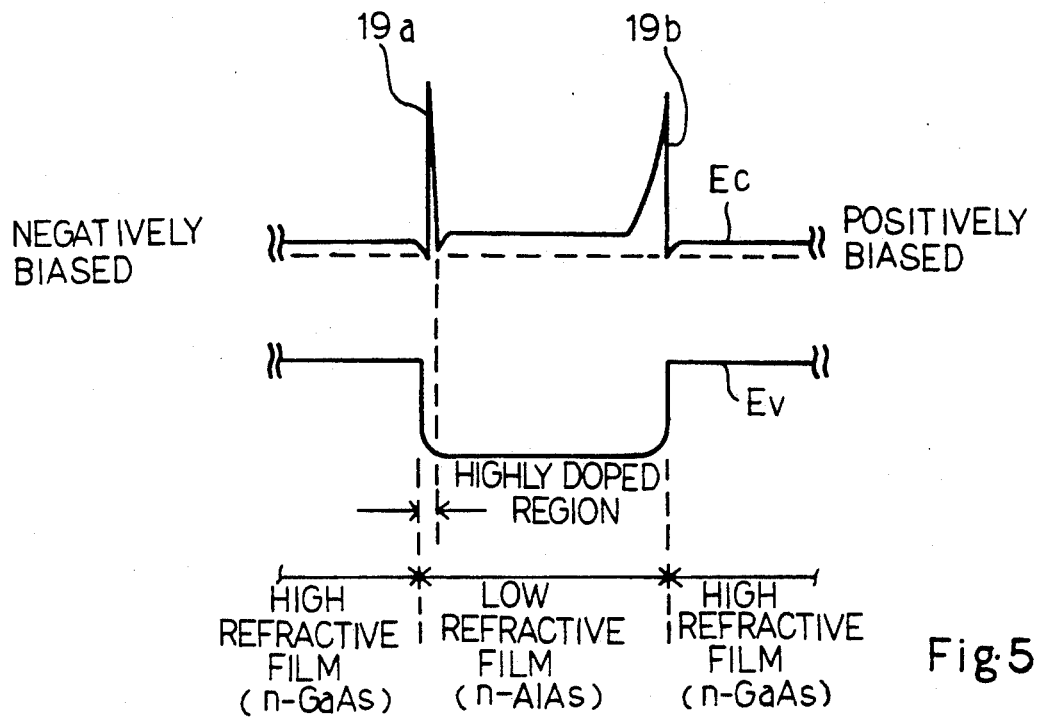
FIG. 5 is a diagram showing the energy band produced in a lower distributed Bragg reflector incorporated in the surface emitting laser device shown in FIG. 4 in thermal equilibrium.

FIG. 5 shows an energy band produced in the lower distributed Bragg reflector 12 in thermal equilibrium, and Ef stands for the Fermi-level substantially flat throughout the lower distributed Bragg reflector 12. The bottom edges of the conduction bands are labeled with Ec, and Ev is indicative of the upper edges of the valence bands. Spikes 19a and 19b take place at the heterojunctions between each low refractive film 12a and the high refractive films 12b. However, the spike 19a on negatively biased side is narrower than the spike 19b positively biased side due to the heavily doped region 12c. The bottom of the spike 19a is about 20 angstroms in width. Though not shown in the drawings, spikes also take place at the heterojunctions between each low refractive film 16a and the high refractive films 16b. However, the spike on the positively biased side is narrower than the spike on the negatively biased side due to the heavily doped region 16c. The bottom of the narrow spike is also about 20 angstroms in width.

Figure 6:
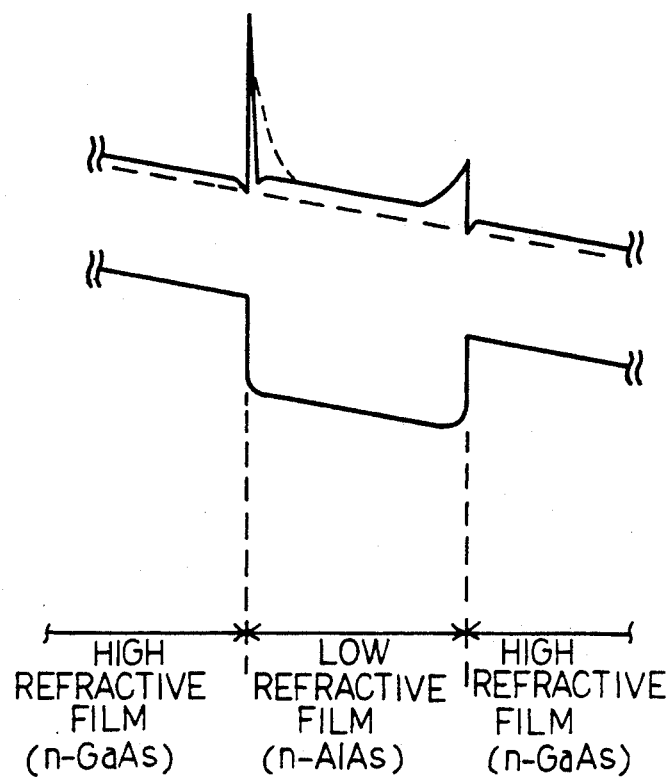
FIG. 6 is a diagram showing the energy band produced in the lower distributed Bragg reflector incorporated in the surface emitting laser device in a biased state.

When the upper electrode 17 is positively biased, the energy band is deformed as shown in FIG. 6, and the narrow spikes allows tunneling current to pass therethrough, thereby decreasing the resistances of the lower and upper distributed Bragg reflectors 12 and 16. Since the spikes produced in the prior art surface emitting laser device (which is indicated by broken lines in FIG.

6) is much wider than the narrow spikes of the present invention, no tunneling current flows.

The surface emitting laser device shown in FIG. 4 is equipped with the lower and upper distributed Bragg reflectors 12 and 16 both having the heavily doped regions. However, the resistance is effectively decreased with the heavily doped regions 12c or 16c formed in one of the lower and upper distributed Bragg reflectors.

Second Embodiment

Figure 7:
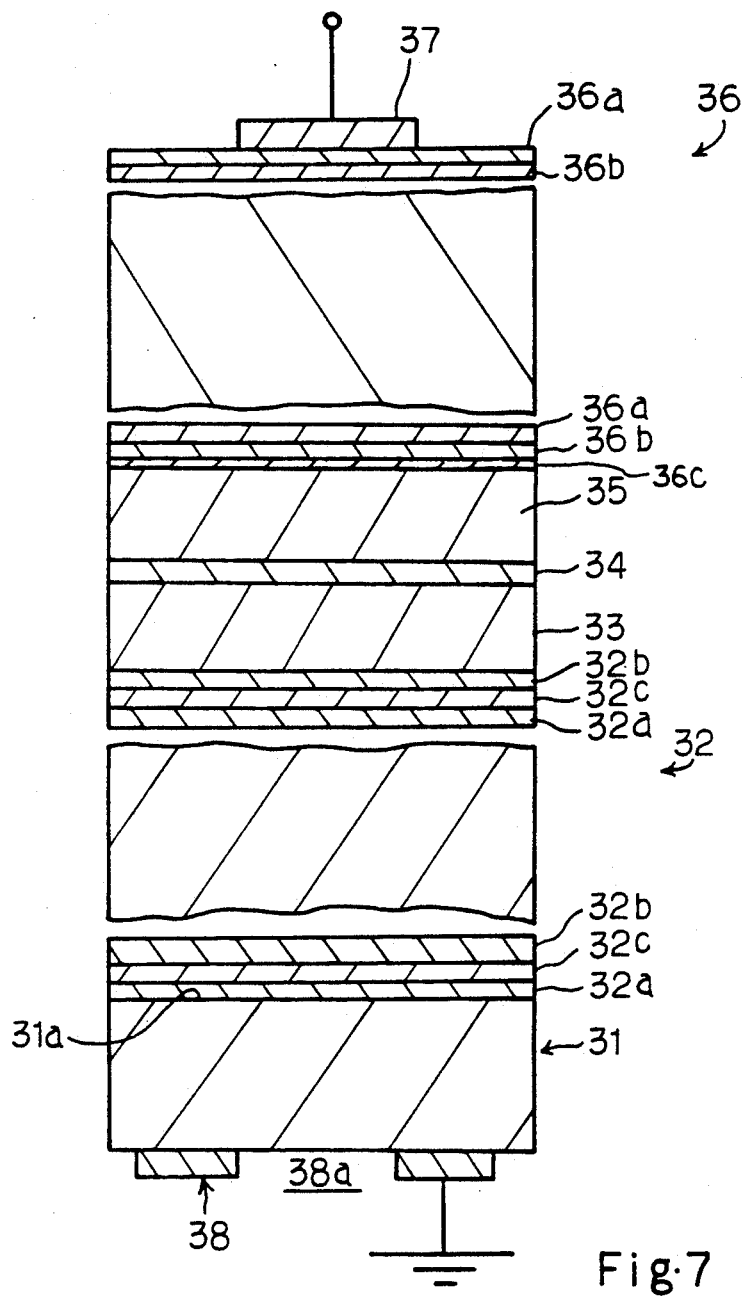
FIG. 7 is a cross sectional view showing the macroscopic structure of another surface emitting laser device according to the present invention.

Turning to FIG. 7 of the drawings, another surface emitting laser device embodying the present invention comprises a substrate 31 of n-type gallium arsenide, an n-type multi-layer reflecting structure 32, a lower clad layer 33, an active layer 34, an upper clad layer 35 and a p-type multi-layer reflecting structure 36, an upper electrode 37 and a lower electrode 38 are formed on the reverse surface of the substrate 31 and the upper surface of the n-type multi-layer reflecting structure 36, respectively. The upper electrode 37 is positively biased with respect to the lower electrode 38, and laser light is taken out from the opening 38a of the lower electrode 38. The n-type multi-layer reflecting structure 32 is implemented by a plurality of semiconductor microstructures, and each of the semiconductor microstructures has a high refractive film 32a of n-type gallium arsenide, a low refractive film 32b of n-type aluminum arsenide and a quasi-graded super-lattice layer 32c in the n-type aluminum arsenide/n-type gallium arsenide system. The p-type multi-layer reflecting structure 36 is similarly implemented by a plurality of microstructures each having a high refractive film 36a, a quasi-graded super-lattice layer 36c and a low refractive film 36b. The p-type multi-layer reflecting structure 36 is similar in structure to the n-type multi-layer reflecting structure 32, and only the n-type multi-layer reflecting structure 32 is described in detail. As will be described hereinlater, the substrate 31 has a major surface 31a where atomic steps 31b are formed at intervals (see FIG. 8).

In the quasi-graded super-lattice structure disclosed by Geels et al, the energy level of the super-lattice is stepwise varied, and, for this reason, carriers are susceptible to influence of quantum-mechanical reflection as well as electrical conduction through resonance. These influences give rise to increase the electrical resistance, and negative-resistance with respect to the bias voltage takes place in the quasi-graded super-lattice structure.

Figure 8:
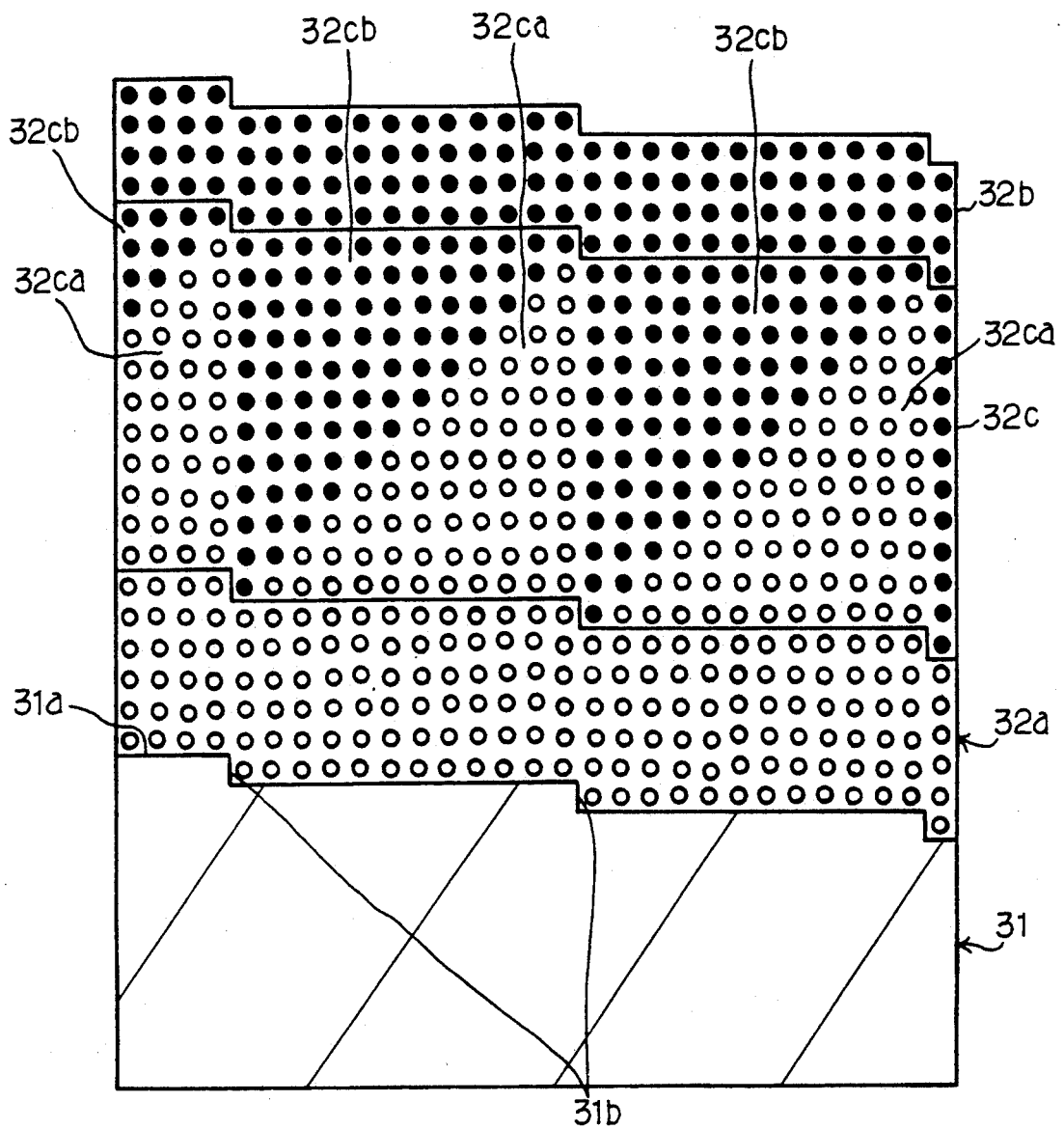
FIG. 8 is a view showing the microscopic structure of a quasi-graded super-lattice structure incorporated in the surface emitting laser device shown in FIG. 7.

However, the quasi-graded super-lattice layer 32c according to the present invention is smoothly changed rather than the quasi-graded super-lattice structure disclosed by Geels et al. In detail, FIG. 8 shows the semiconductor microstructure according to the present invention, and bubbles and dots stand for gallium atoms and aluminum atoms, respectively. However, arsenic atoms of the V group is deleted from FIG. 8 for the sake of simplicity. The quasi-graded super-lattice layer 32c is microscopically formed by non-inverted mesa-shaped micro, stripes 32ca of n-type gallium arsenide and inverted mesa-shaped micro-stripes 32cb of n-type aluminum arsenide, and the non-inverted mesa-shaped micro-stripes 32ca and the interdigitated to one another. The compositions of the mesa-shaped micro-stripes 32ca and 32cb are graded in atom, and the atomic steps 31b allow the mesa-shaped micro-stripes 32ca and 32cb to take place as will be described hereinlater. The quasi-graded super-lattice layer 32c is uniform in a direction normal to the paper on which FIG. 8 is drawn.

When the bias voltage is applied to the surface emitting laser device shown in FIG. 7, electrons upwardly drift along the mesa-shaped micro-stripes 32ca, and the energy level varying with the graded composition gently affects the electrons. Such a gentle influence is less liable to produce the quantum-mechanical reflections, and, accordingly, gives rise to decrease the electrical resistance in the lower multi-layer reflecting structure 32.

Description is hereinbelow made on a process sequence for fabricating the surface emitting laser device shown in FIG. 8. The process sequence starts with preparation of the n-type gallium arsenide substrate 31. Since the substrate 31 has a crystal surface slightly oblique from an orientation with a low index such as (100) (110) or (111), the atomic steps 31b take place in the major surface 31a. The crystal surface thus oblique from the low index crystal surface serves as a major surface. For example, if the crystal surface of a gallium arsenide substrate is oblique from (100) orientation by theta degree, each atomic step is spaced apart from the adjacent atomic step by (160/theta) angstroms. When theta is 1 degree, 2 degrees or 4 degrees by way of example, the interval is 160 angstroms, 80 angstroms or 40 angstroms. The crystal surface of the n-type gallium arsenide substrate 31 is assumed to be oblique from (100) orientation by 1 degree, and the intervals are about 160 angstroms.

Using a molecular beam epitaxy, the lower multi-layer reflecting structure is formed on the crystal surface 31a. In detail, the n-type gallium arsenide is grown on the crystal surface 31a of the substrate 31 so as to form the high refractive film 32a, and the atomic steps and the terrace portions are transferred to the surface of the high refractive film 32a. Subsequently, the quasi-graded super-lattice layer 32c is grown on the upper surface of the high refractive film 32a, and is formed through a sequence where n-type aluminum arsenide and n-type gallium arsenide are alternately grown in such a manner that the n-type aluminum arsenide and the n-type gallium arsenide thus alternately grown is as thick as a single atomic layer of (100) orientation, i.e., about 2.8 angstroms. The molecular beam epitaxy thus carried out allows the n-type aluminum arsenide and the n-type gallium arsenide to be laterally grown from the vertical surface of the atomic steps 31b, and micro composite films of n-type aluminum arsenide and n-type gallium arsenide are sequentially layered on the surface of the refractive film 32a.

Assuming now that the quasi-graded super-lattice layer 32c is approximately equal to nine atomic layers corresponding to 25.2 angstroms of gallium arsenide, the n-type aluminum arsenide is grown by 0.28 angstrom or 1/10 atomic layer, and the n-type aluminum arsenide occupies on the terrace portions in the vicinity of the vertical surfaces of the atomic steps 31b. Then, n-type gallium arsenide is grown by 2.52 angstroms or 9/10 atomic layer, and laterally extends from the n-type aluminum arsenide. The epitaxially growth thus laterally extending from the atomic steps 31b are called as "step flow mode". Subsequently, the n-type aluminum arsenide is grown by 0.56 angstrom or 2/10 atomic layer, and the n-type gallium arsenide is grown by 2.24 angstroms or 8/10 atomic layer, thereby completing the second micro composite film. Thus, the n-type aluminum arsenide is gradually increased, and the n-type gallium arsenide is decreased with height. In other words, the content of the n-type aluminum arsenide is increased at 1/(n+1) when the micro composite films are layered. Finally, the micro composite films form in combination the quasi-graded super-lattice layer 32c with atomic steps and terrace portions on the upper surface thereof. On the upper surface of the quasi-graded super-lattice layer 32c is epitaxially grown the low refractive film 32b, and the atomic steps and the terrace portions are transferred to the upper surface of the low refractive film 32b. The structure shown in FIG. 8 is obtained.

The atomic steps and the terrace portions on the upper surface of the low refractive film allow the high refractive film of the next semiconductor microstructure to have the atomic steps and the terrace portions, and the quasi-graded super-lattice layer of the next semiconductor microstructrre is formed by using the atomic steps and the terrace portions. The molecular beam epitaxy is repeated, and a predetermined number of semiconductor microstructures form in combination the lower multi-layer reflecting structure 32. On the lower multi-layer reflecting structure 32 are sequentially grown the lower clad layer 33, the active layer 34, the upper clad layer 35 and the upper multi-layer reflecting structure 36 by using the molecular beam epitaxy, and the upper and lower electrodes 37 and 38 are formed as shown in FIG. 7.

As will be understood from the foregoing description, the atomic steps 31b on the crystal surface of the substrate 31 are transferred from film to film throughout the lower multi-layer reflecting structure 32, and allows the quasi-graded super-lattice layer 32c to gradually change the composition of the compound semiconductor material.

Figure 9A:
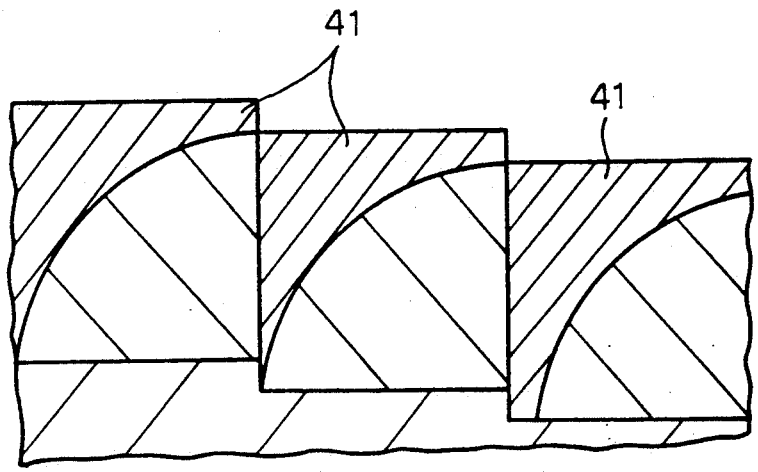
FIG. 9A to 9C are views respectively showing quasi-graded super-lattice structures according to the present invention.
Figure 9B:
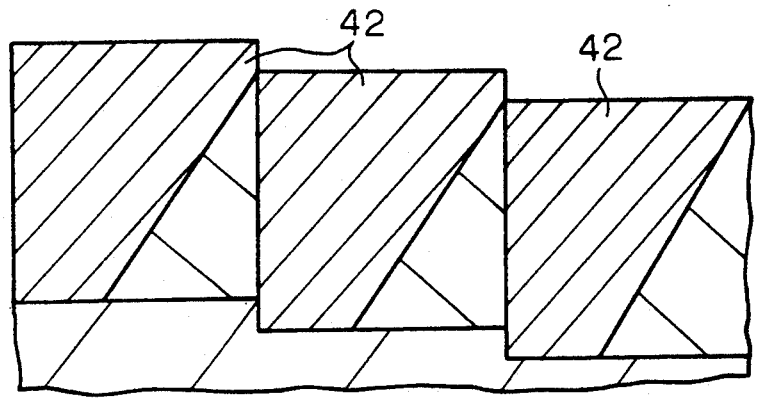
Figure 9C:
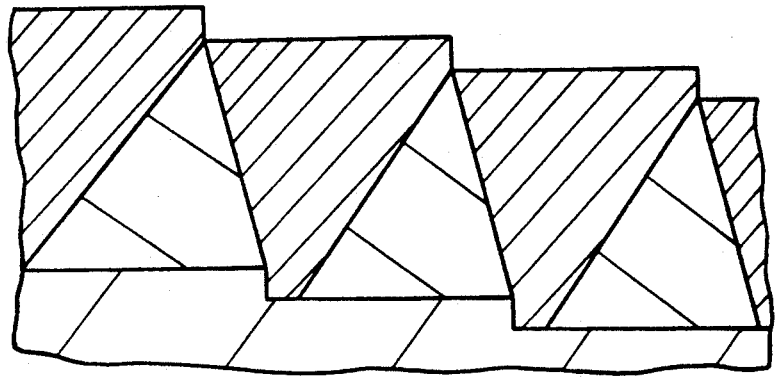

The quasi-graded super-lattice layer 32c linearly changes the content of the n-type aluminum arsenide as well as the content of the n-type gallium arsenide. However, the content of the n-type aluminum arsenide 41 may be increased along a curve of secondary degree as shown in FIG. 9A. If the increment of the content of n-type aluminum arsenide is more than (1/n+1), upper micro composite films are formed of the n-type aluminum arsenide 42 only as shown in FIG. 9B. If the micro composite film is slightly shorter than a single atomic layer, the atomic steps are laterally moved as shown in FIG. 9C.

The process sequence described hereinbefore uses the molecular beam epitaxy. However, any epitaxial growth achieving the step flow mode is available. The epitaxial growth available may be migration enhancement epitaxy abbreviated as "MEE" or a metal-organic chemical vapor deposition abbreviated as MO-CVD. The quasi-graded super-lattice layer may be p-type, i-type or n-type, and may be varied from aluminum arsenide to gallium arsenide.

A quasi-graded super-lattice layer according to the present invention may be in the GaAs/AlGaAs system, GaAs/InGaP system or InP/InGaAs system.

Although particular embodiments of the present invention have been shown and described, it will be obvious to those skilled in the art that various changes and modifications may be made without departing from the spirit and scope of the present invention. For example, the multi-layer reflecting structure is applicable to any optical device with a reflector through which current flows, and the applicable optical devices include a super-radiant type light-emitting diode with varied refractive index, a surface emitting type light-emitting diode with a reflector provided on the opposite side of a light-emitting surface for improving light radiation efficiency, a surface light emitting device of a p-n-p-n type and a switching device.

The quasi-graded super-lattice layer may be incorporated in a hetero-bipolar transistor.

What is claimed is:

1. An optical device fabricated on a substrate, comprising:
    a) an active layer provided for light;
    b) a lower multi-layer reflecting structure provided on one side of said active layer, and having a plurality of combinations each implemented by an n-type low refractive film and an n-type high refractive film different in refractive index as well as in energy band gap;
    c) an upper multi-layer reflecting structure provided on the opposite side of said active layer, and having a plurality of combinations each implemented by a p-type low refractive film and a p-type high refractive film different in refractive index as well as in energy band gap; and
    d) a pair of electrodes operative to apply bias voltage across said lower and upper multi-layer reflecting structures to said active layer for producing light, at least one of said n-type low refractive film and said p-type low refractive film having a heavily doped region extending from a first heterojunction negatively biased toward a second heterojunction on the opposite side thereof in case of said n-type low refractive film or from said second heterojunction positively biased toward said first heterojunction in case of said p-type low refractive film, said heavily doped region having an impurity profile substantially tracing plots of a delta function.

2. An optical device as set forth in claim 1, in which the other of said n-type low refractive film and said p-type low refractive film has a heavily doped region extending from a first heterojunction negatively biased in case of said n-type low refractive film or from a second heterojunction positively biased in case of said p-type low refractive film, said heavily doped region having an impurity profile substantially tracing plots of a delta function.

3. An optical device as set forth in claim 2, in which said optical device is a surface emitting laser device.

4. An optical device as set forth in claim 3, in which the thickness of each heavily doped region is greater than zero angstroms and not greater than about 100 angstroms.

5. An optical device as set forth in claim 3, in which the thickness of each heavily doped region is about 20 angstroms.

6. An optical device fabricated on a substrate having atomic steps formed at intervals on a major surface thereof and terrace portions each extending over one of said intervals, comprising:
    a) a lower multi-layer reflecting structure of a first conductivity type grown on said major surface, and implemented by a plurality of semiconductor microstructures, each of said semiconductor microstructures having a high refractive film formed of a first compound semiconductor material mainly composed of a first element and a second element, a low refractive film formed of a second compound semiconductor material mainly composed of said second element and a third element, and a quasi-graded super-lattice layer inserted between said high refractive film and said low refractive film, and formed of a third compound semiconductor material mainly composed of said first to third elements, said atomic steps and said terrace portions being sequentially transferred to a surface of each high refractive film, to a surface of each quasi-graded super-lattice layer and to a surface of each low refractive film, said quasi-graded super-lattice layer being implemented by a plurality of non-inverted mesa-shaped micro-stripes of said first compound semiconductor material interdigitated with a plurality of inverted mesa-shaped micro-stripes of said second compound semiconductor material, each of said non-inverted mesa-shaped micro-stripes projecting from one of said terrace portions on said surface of said high refractive film in such a manner that the width thereof is gradually decreased, each of said inverted mesa-shaped micro-stripes interdigitated between two of said non-inverted mesa-shaped micro-stripes projecting in such a manner that the width thereof is gradually increased;

b) an active structure for light formed on said lower multi-layer reflecting structure;

c) an upper multi-layer reflecting structure formed on said active structure, and having a second conductivity opposite to said first conductivity; and d) a pair of electrodes for applying bias voltage across said lower and upper multi-layer reflecting structures to said active structure.

7. An optical device as set forth in claim 6, in which each of said non-inverted mesa-shaped micro-stripes is formed by a plurality of microscopic films respectively aligned with microscopic films of each inverted mesa-shaped micro-stripe so as to form a plurality of microscopic composite films, said plurality of microscopic composite films being varied in the content of said first element as well as in the content of said third element so that said third compound semiconductor material is graded in composition.

8. An optical device as set forth in claim 7, in which said first to third elements are gallium, arsenic and aluminum.

9. A multi-layer reflecting structure fabricated on a substrate and applied with bias voltage for producing light, comprising: a plurality of combinations each having a) a low refractive film, and b) a high refractive film different in refractive index as well as in energy band gap from said low refractive film, said low refractive film having a heavily doped region extending from a first heterojunction negatively biased toward a second heterojunction on the opposite side thereof in case of n-type conductivity or from said second heterojunction positively biased toward said first heterojunction in case of p-type conductivity.

10. A quasi-graded super-lattice structure fabricated on a substrate having atomic steps at intervals and terrace portions each extending over one of said intervals, comprising: a high refractive film formed of a first compound semiconductor material mainly composed of a first element and a second element, a low refractive film formed of a second compound semiconductor material mainly composed of said second element and a third element, and a quasi-graded super-lattice layer inserted between said high refractive film and said low refractive film, and formed of a third compound semiconductor material mainly composed of said first to third elements, said atomic steps and said terrace portions being sequentially transferred to a surface of each high refractive film, to a surface of each quasi-graded super-lattice layer and to a surface of each low refractive film, said quasi-graded super-lattice layer being implemented by a plurality of non-inverted mesa-shaped micro-stripes of said first compound semiconductor material, each of said non-inverted mesa-shaped micro-stripes projecting from one of said terrace portions on said surface of said high refractive film in such a manner that the width thereof is gradually decreased, each of said inverted mesa-shaped micro-stripes interdigitated between two of said non-inverted mesa-shaped micro-stripes projecting in such a manner that the width thereof is gradually increased.

* * * * *